(12) United States Patent
Reinmuth et al.

(10) Patent No.: US 9,035,432 B2
(45) Date of Patent: May 19, 2015

(54) COMPONENT HAVING THROUGH-HOLE PLATING, AND METHOD FOR ITS PRODUCTION

(71) Applicants: Jochen Reinmuth, Reutlingen (DE); Heribert Weber, Nuertingen (DE); Timo Schary, Bremen (DE); Yvonne Bergmann, Reutlingen (DE)

(72) Inventors: Jochen Reinmuth, Reutlingen (DE); Heribert Weber, Nuertingen (DE); Timo Schary, Bremen (DE); Yvonne Bergmann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 13/915,353

(22) Filed: Jun. 11, 2013

(65) Prior Publication Data

US 2013/0341766 A1    Dec. 26, 2013

(30) Foreign Application Priority Data

Jun. 14, 2012   (DE) .................. 10 2012 210 033

(51) Int. Cl.
| | |
|---|---|
| *H01L 29/40* | (2006.01) |
| *H01L 31/00* | (2006.01) |
| *H01L 23/495* | (2006.01) |
| *H01L 23/48* | (2006.01) |
| *H01L 21/768* | (2006.01) |

(52) U.S. Cl.
CPC ........ *H01L 23/481* (2013.01); *H01L 21/76898* (2013.01); *H01L 2924/0002* (2013.01)

(58) Field of Classification Search
CPC .................. H01L 21/76898; H01L 23/481
USPC ........... 257/621, 417, 774, 62, 784, E21.502, 257/698; 438/51, 424, 667, 19, 109, 127, 438/137; 428/137
See application file for complete search history.

(56) References Cited

U.S. PATENT DOCUMENTS

| | | | | |
|---|---|---|---|---|
| 2004/0077154 | A1* | 4/2004 | Nagarajan et al. | 438/455 |
| 2007/0143994 | A1* | 6/2007 | Primavera et al. | 29/852 |
| 2007/0228576 | A1* | 10/2007 | Trezza | 257/774 |
| 2008/0203556 | A1* | 8/2008 | Huang | 257/698 |
| 2009/0140606 | A1* | 6/2009 | Huang | 310/322 |
| 2012/0037412 | A1* | 2/2012 | Reinmuth | 174/260 |

FOREIGN PATENT DOCUMENTS

DE    10 2009 045 385    4/2011

* cited by examiner

*Primary Examiner* — Long K Tran
*Assistant Examiner* — Dzung Tran
(74) *Attorney, Agent, or Firm* — Kenyon & Kenyon LLP

(57) ABSTRACT

A method for producing a component having a semiconductor substrate with through-hole plating is provided, the through-plating being surrounded by a recess, and the semiconductor substrate having a first layer on one side, which covers the recess on the first side. The semiconductor substrate has a second layer on a second side, which covers the recess on the second side, and the through-hole plating is surrounded by a ring structure which is produced from the semiconductor substrate. The recess surrounding the ring structure is produced in the same process step or at the same time as the recess for the through-hole plating.

16 Claims, 27 Drawing Sheets

COMPONENT HAVING THROUGH-HOLE PLATING, AND METHOD FOR ITS PRODUCTION

BACKGROUND OF THE INVENTION

1. Field of the Invention

The present invention relates to a component having a semiconductor substrate provided with through-hole plating, and to a method for producing such a component.

2. Description of the Related Art

A component having a semiconductor substrate and through-hole plating is known from published German patent application document DE 10 2009 045 385 A1. The through-hole plating is developed in the form of a metallic line, which is situated in the semiconductor substrate and routed from a top side of the substrate to a bottom side. The through-hole plating is separated from the surrounding semiconductor substrate via an insulation layer. In another development, a through-hole plating is separated from the surrounding semiconductor substrate by an annular trench.

BRIEF SUMMARY OF THE INVENTION

It is an object of the present invention to provide a component having a semiconductor substrate and electrical through-hole plating, in which the through-hole plating is able to be produced in a stable and cost-effective manner.

One advantage of the component is that the through-hole plating is easily produced in a cost-effective manner, also has a stable form, and forms a low (parasitic) capacitance in the region of the through-hole plating. This is possible because the through-hole plating is surrounded by an annular structure of the semiconductor material. In addition, the through-hole plating is electrically separated from the surrounding semiconductor substrate by an annular trench, which surrounds the ring structure. The use of the ring structure featuring a channel which is at least partially filled with an electrically conductive material and which is produced around the ring structure, preferably in the same process step or at the same time/simultaneously with the annular trench, ensures high mechanical stability of the through-hole plating. Moreover, the ring structure offers the possibility of simple production methods for filling the channel, which range from CVD, ALD, sputtering, galvanic techniques, dispensing to fluidly filling the metal material or by pressing in a paste, e.g., utilizing screen printing methods.

In another development, the first layer is at least partially developed above the recess and/or in the region of the through-hole plating, in the form of a lattice structure. For one, the lattice structure allows simple processing of the component, and reliable and stable sealing of the recess surrounding the ring structure for another.

In a further specific embodiment, the first layer includes an insulation layer and/or a moisture barrier layer. The insulation layer provides reliable electrical insulation, and the moisture barrier layer provides reliable protection from moisture that may penetrate the recess and/or the through-hole plating.

In a further specific development, the through-hole plating is developed in the form of a sleeve, the through-hole plating being applied on an inside of the ring structure. The sleeve form provides a through-hole plating which offers excellent conductivity but uses little material.

In one further specific embodiment, the sleeve-type through-hole plating is filled with insulation material. This protects the through-hole plating from moisture and improves the mechanical stability of the through-hole plating.

In one further specific embodiment, the through-hole plating has a stepped, widening diameter in the region of the first layer. This not only simplifies the production of the through-hole plating, but also improves the electrical conductivity of the through-hole plating and in particular, the electrical contacting of the through-hole plating.

In one further specific embodiment, the through-hole plating has a stepped, tapering diameter in the region of the first layer. This specific embodiment offers the advantage that when the electrically conducting material is deposited to form the through-hole plating, an unfilled region automatically remains. The advantage of this development is that it allows stresses to be reduced in more optimal manner, the stress being caused by the differences in the thermal expansion coefficients between the material for forming the through-hole plating and the surrounding semiconductor material.

When the component has a through-hole plating whose diameter widens in the region of the first layer, low-impedance through-hole platings are easily able to be developed as solid cylinders or also as hollow cylinders.

In one further specific development, the through-hole plating is covered by an insulation layer on the outside. This improves the electrical insulation from the surrounding ring structure and from the component.

In one further specific embodiment, the first layer is developed in the form of a lattice structure and an insulation layer applied thereon. The lattice structure abuts the recess. This achieves simple processing through placement of the lattice structure and reliable sealing of the recess through the placement of the insulation layer. The lattice structure is also attached to the ring structure, so that increased mechanical stability is achieved for the ring structure.

In another specific embodiment, a second lattice structure is provided in the first layer, the second lattice structure being formed between the insulation layer and the first lattice structure. The second lattice structure is produced from a metal or a metallic compound such as a metal oxide compound. The advantage of the second lattice structure is that the etch attack on the second lattice structure in an insulation trench process is considerably weaker than in the case of a lattice produced from an insulation material, especially silicon oxide. This in turn means that the etch holes of the lattice widen only minimally and that less sealing oxide needs to be deposited in order to seal them. This is apparent in particular at high etching depths and the related long etching times.

In one further specific embodiment, the second lattice is connected to the through-hole plating in electrically conductive manner. This makes it possible to provide an electrical shield which suppresses interference signals on the through-hole plating and the electric and/or electronic circuits situated in the semiconductor substrate or in the second layer, for example. In one further specific embodiment, the second lattice is used as capacitor structure, which is electrically insulated from the through-hole plating and the supply lines. This makes it possible to suppress interference signals.

In another specific embodiment, the through-hole plating extends through the first and the second lattice. This specific embodiment offers the advantage that in the deposition of the electrically conductive material for the development of the through-hole plating, the material preferably is deposited on the surfaces. This deposition procedure lasts until the second lattice has grown over at the surface. Despite a recess in the ring structure that has a large cross-section, this makes it possible to obtain the advantages with regard to the etching rate of the semiconductor material of the ring structure, i.e., that the sealing of the ring structure recess by the electrically conducting material of the through-hole plating leads to only a slight topography at the surface. Once the metallic layer has been deposited, it will already be possible to use standard lithography methods to pattern the deposited metallic layer.

In one further specific embodiment, the ring structure has a plurality of through-hole platings which may constitute capacities or inductivities, depending on the design, whose interconnection may take place at a component top side or within the component itself.

In one further specific embodiment, the circuit track serves as shield.

The described component has the advantage of reducing parasitic capacities between the low-impedance through-hole plating and the substrate. In addition, no heavily doped semiconductor material is required any longer for the through-hole plating, which allows this type of through-hole plating to be used in ASICs as well.

DETAILED DESCRIPTION OF THE INVENTION

Figure 1:
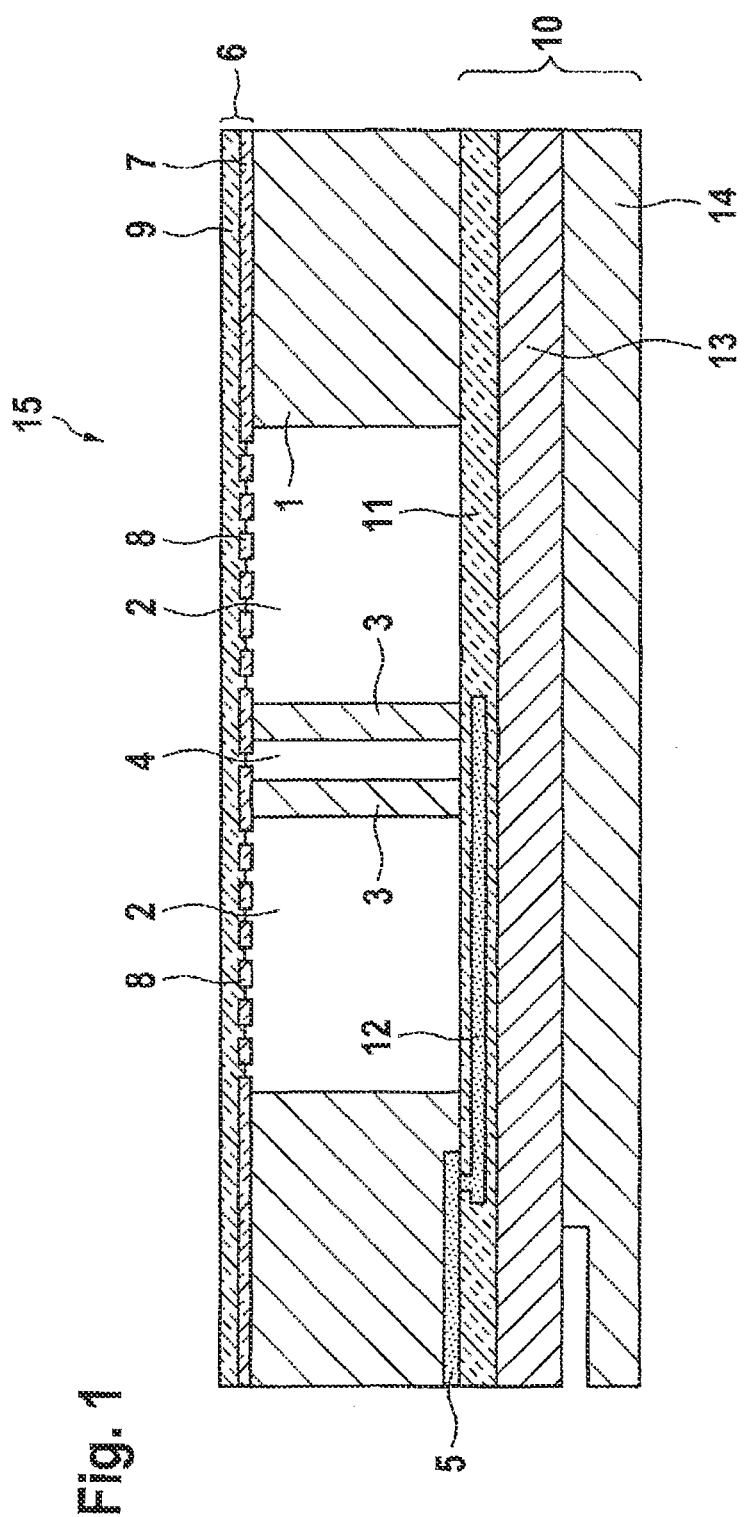
FIGS. 1 through 3 show three method steps for producing a component.

FIG. 1 shows a schematic cross-sectional view of a substrate 1, which is developed as semiconductor substrate, for instance, especially one made of silicon. Substrate 1 has an annular recess 2, which surrounds a ring structure 3 and electrically insulates it from further substrate 1. Ring structure 3 has a second recess 4. Both the first and second recess 2, 4 extend through the entire thickness of substrate 1 and preferably are produced in the same process step or at the same time/simultaneously. Depending on the selected specific embodiment, electric and/or electronic circuits 5 may be developed on a top surface of substrate 1. Circuits 5 are shown schematically, as block on the front side of substrate 1. A rear side of substrate 1 is covered by a first layer 6. First layer 6 has a lattice layer 7, which is connected to the rear side of substrate 1 and to the rear side of ring structure 3. Lattice layer 7 is at least partially provided with a lattice structure 8 in the region of recess 2. Lattice layer 7, for example, is made of insulation material, especially an oxide, in particular a silicon oxide.

In addition, first layer 6 has a sealing layer 9, which is situated on top of lattice layer 7. Lattice layer 9 is made of insulation material, especially an oxide, such as silicon oxide. Sealing layer 9 covers lattice layer 7 both in the region of lattice structure 8 and in the other regions.

The front side of substrate 1 is covered by a second layer 10. Second layer 10 has a first insulation layer 11, which is situated on the front side of substrate 1 and covers recess 2, 4. First insulation layer 11, for example, is produced from an oxide, especially silicon oxide. An electric line 12, which is routed into the region of second recess 4, is situated in first insulation layer 11. In the illustrated exemplary embodiment, electric line 12 is connected to circuit 5. Depending on the selected specific embodiment, electric line 12 may also be connected to other circuits.

In the illustrated exemplary embodiment, second layer 10 includes a functional layer 13, in which movable structures and/or electric circuits are disposed. The movable structures may be developed in the form of sensor structures, e.g., inertial sensors. Functional layer 13, for example, is from an epilayer. A cover layer 14 is developed on the front side of functional layer 13. Cover layer 14, for instance, may be produced from a semiconductor material and realized in the form of a cap wafer. Depending on the selected specific embodiment, it is also possible to dispense with functional layer 13 and/or cover layer 14.

Component 15 shown in FIG. 1 is developed as ASIC/sensor wafer having a bonded cap wafer, for example. However, the component may also be realized in others forms for which electric through-hole plating through a substrate is used.

In addition to, or instead of, the inertial sensors, it is also possible to provide pressure sensors in functional layer 13. Furthermore, cover layer 14 may have additional recesses, which are located in the region of the sensor structures of functional layer 13, in order to improve the freedom of movement of the sensor structures. The connection of cover layer 14 on functional layer 13, which may be developed in the form of a sensor wafer, for example, is accomplished by standard bonding methods, such as seal glass bonding, eutectic bonding or fusion bonding. Optionally, substrate 1 is thinned on the rear side by grinding, CMP and plasma etching in order to reduce the trenching times or to allow the realization of required maximum stack thicknesses. The latter may require thinning of cover layer 14 as well.

To implement electrical contacting through substrate 1, for example in order to contact circuits 5, an electric access is produced from the rear side of substrate 1. Recess 2 and second recess 4 were produced in such a way that lattice layer 7 is deposited on substrate 1 and patterned. Patterned lattice layer 7 then is used as trench etching mask for removal of the substrate material situated underneath in the region of recess 2 and second recess 4. This is how ring structure 3 which surrounds recess 2 is produced. In addition, this also introduces second recess 4 into ring structure 3 simultaneously/at the same time. Ring structure 3 is secured both on lattice layer 7 and on second insulation layer 11. Lattice layer 7 assumes several functions. For one, lattice layer serves as etching mask and fixates the ring structure at its surface. For another, lattice layer 7 serves as basis for a self-supporting diaphragm in the form of lattice structure 8, which is formed between the ring structure and surrounding substrate 1.

FIG. 1 illustrates the state following the insulation trench production and sealing of lattice structure 7 by cover layer 9. Electric line 12 situated in the region of second recess 4 preferably has a larger area than second recess 4 and is situated in such a way that electric line 12 covers the area of second recess 4.

Figure 2:
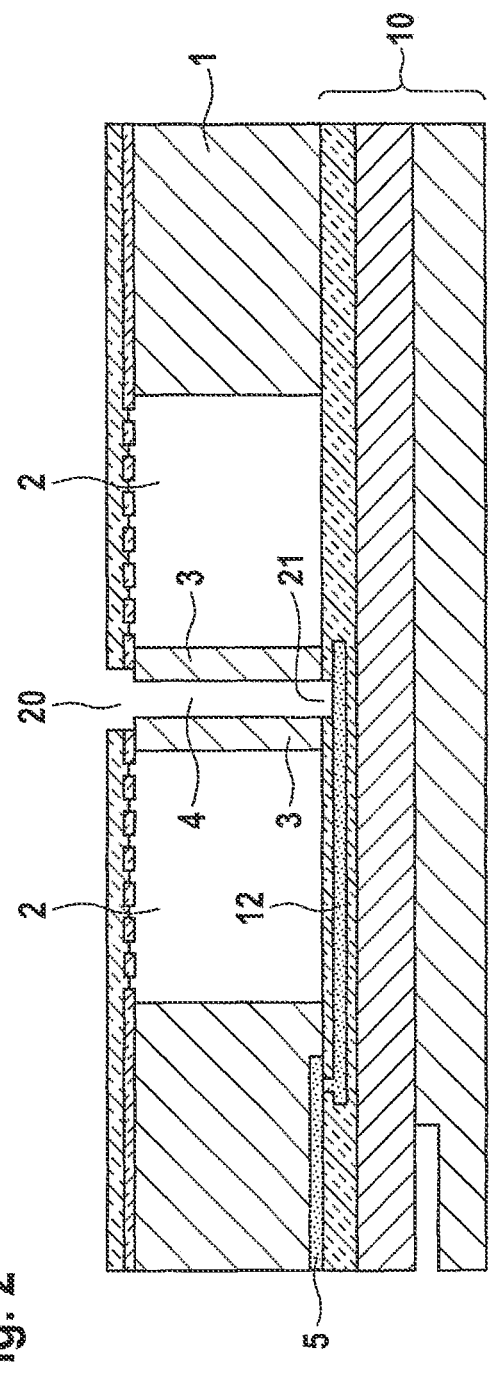

Using standard lithography methods, followed by a plasma-etching step, cover layer 9 and lattice layer 7 are then removed above the second recess. Opening 20 in first layer 6, i.e., in lattice layer 7 and in sealing layer 9, is selected slightly larger than the diameter of second recess 4. In this etching step, removal 21 of first insulation layer 11 at the bottom of second recess 4 is achieved simultaneously, the etching process stopping at electrical line 12. For example, electrical line 12 is part of a multi-layer metallization developed in second layer 10. This method step is illustrated in FIG. 2.

Figure 3:
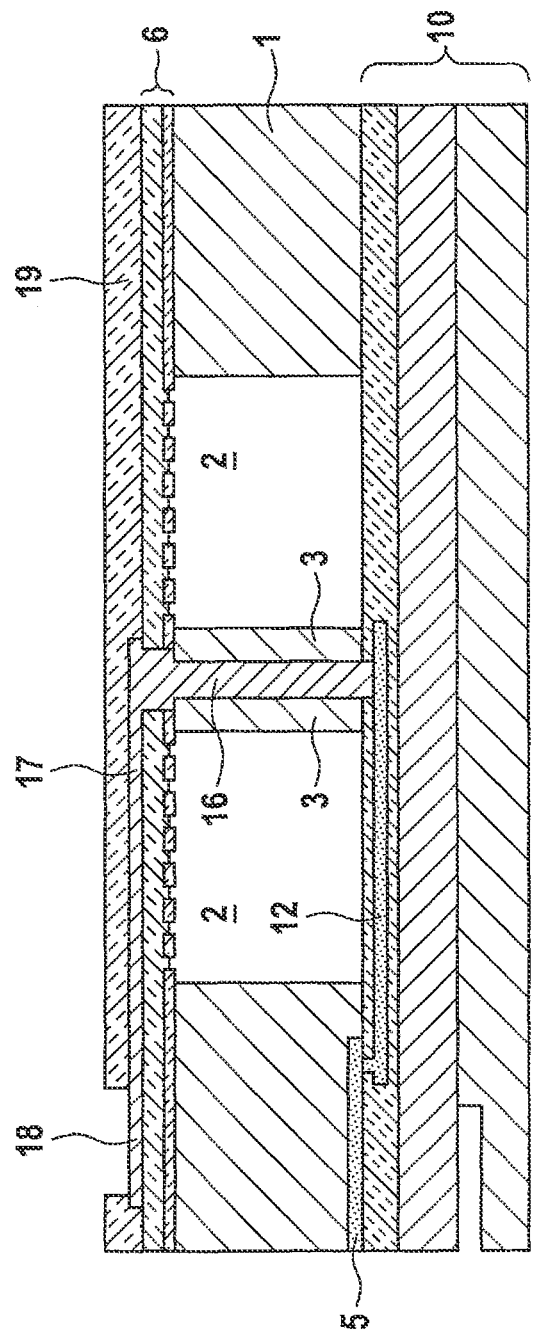

As can be gathered from FIG. 3, a conductive material such as wolfram, copper, aluminum, AlSiCu, AlCu, silver or gold is introduced into second recess 4 using standard methods such as CVD, ALD, sputtering, galvanic technology, dispensing, ink-jetting or screen printing, so that a through-hole plating 16 is formed. Depending on the deposition method, a CMP method may be used to planarize the material at the surface of the substrate, if required. In the process, the material deposited on the substrate surface and inside second recess 4, for instance, may be planarized only at the surface in order to allow it to be patterned with the aid of standard lithographic methods. In addition, the deposited material is able to be planarized until the filler material is removed from the substrate surface and remains only in second recess 4. In the first method, the circuit tracks and the bond pads may be made of the filler material. In the second method, the circuit tracks and the bond pads are produced in a separate method step.

Once through-hole plating 16, a circuit track 17 and a bond pad 18 have been produced, a protective layer 19 is optionally applied on sealing layer 9, circuit track 17 and on bond pad 18. As an option, protective layer 19 may also include a moisture barrier layer. Protective layer 19 is subsequently removed again in the region of bond pad 18. Protective layer 19 may be produced from an insulation material such as silicon oxide. Silicon nitride ($Si_3N_4$), for example, is able to be used for the moisture barrier layer. With the aid of the described method, it is easily possible to realize a low-impedance through-hole plating 16 through substrate 1, which is mechanically stable and has few parasitic capacitances. Through-hole plating 16 is connected to electrical line 12.

Ring structure 3 serves as auxiliary structure in the described system, at whose inner wall a low-impedance layer is deposited. Depending on the filling method, the ring structure acts as bridge for a metallization between a substrate surface and metallic multi-layer wiring on the sensor front side (e.g., in the case of CVD or ALD), or as lateral delimitation to prevent spreading into the insulation region provided by recess 2 (e.g., in the case of inkjet, dispensing or screen-printing techniques).

The use of the through-hole plating variant in the form of an electrically insulated ring structure having a low-impedance core in the form of through-hole plating 16, thus is also possible for ASICs, in which the substrate material usually has rather low doping and consequently low conductivity.

In FIG. 3, through-hole plating 3 has a cylindrical design, and the diameter of through-hole plating 3 widens in the region of first layer 6, especially in a step-wise manner.

Figure 4:
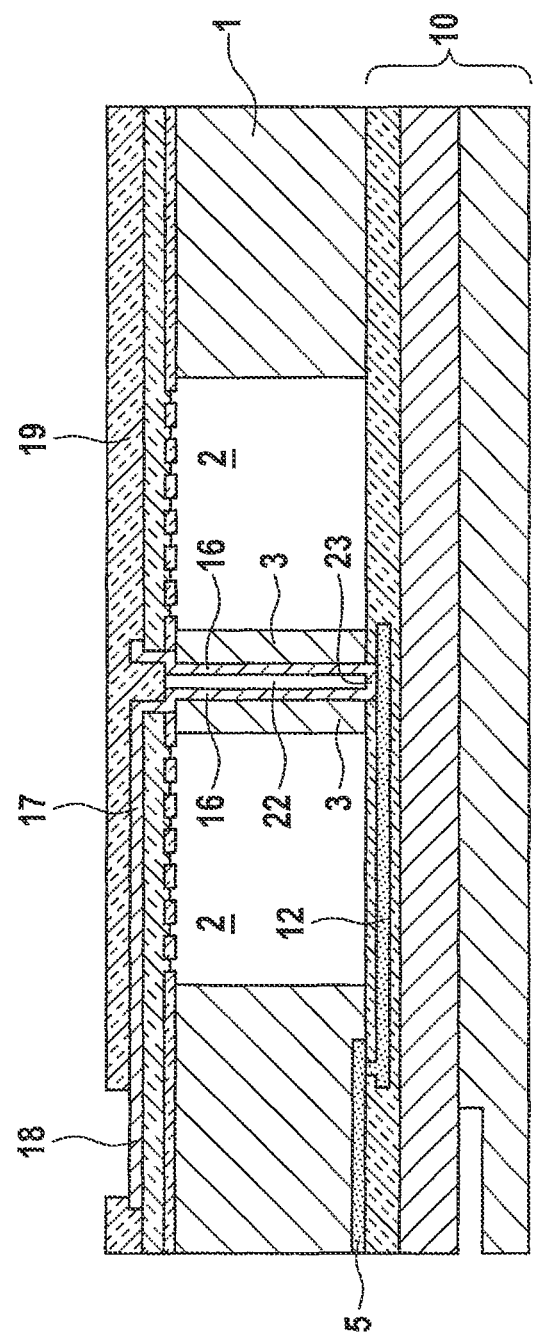
FIGS. 4 through 8 show additional specific embodiments of the component.

FIG. 4 shows another specific embodiment of the component, in which through-hole plating 16 is developed in the form of a sleeve. Through-hole plating 16 is developed as sleeve both on the inside of ring structure 3 and on the corresponding inner sides of lattice layer 7 and sealing layer 9. In addition, through-hole plating 16 has a cavity 22, which is cylindrical and extends from a front side of substrate 1 into lattice layer 7. Through-hole plating 16 thus has a sleeve shape, and a base region 23 situated on electric line 12 is likewise produced from the material of through-hole plating 16. In the exemplary embodiment, protective layer 19 is situated in an upper end region of through-hole plating 16 and extends into the region of lattice layer 7. As a result, cavity 22 is sealed by protective layer 19.

Figure 5:
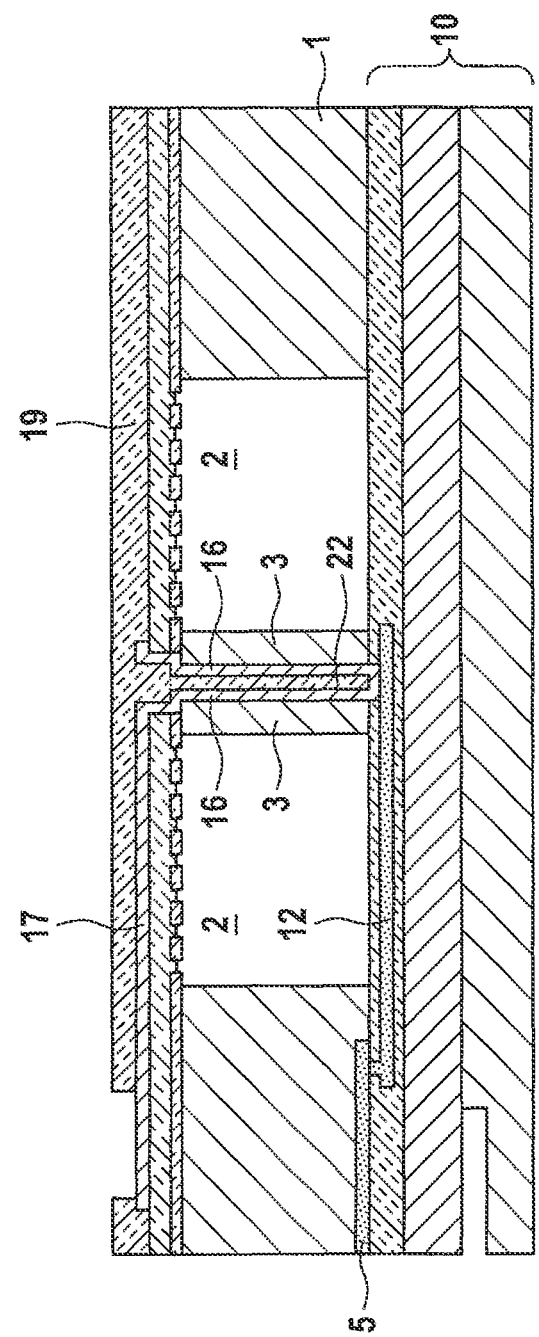

FIG. 5 shows another specific development of component 15, in which cavity 22 of through-hole plating 16 is completely filled by protective layer 19 in the region of first layer 6.

Figure 6:
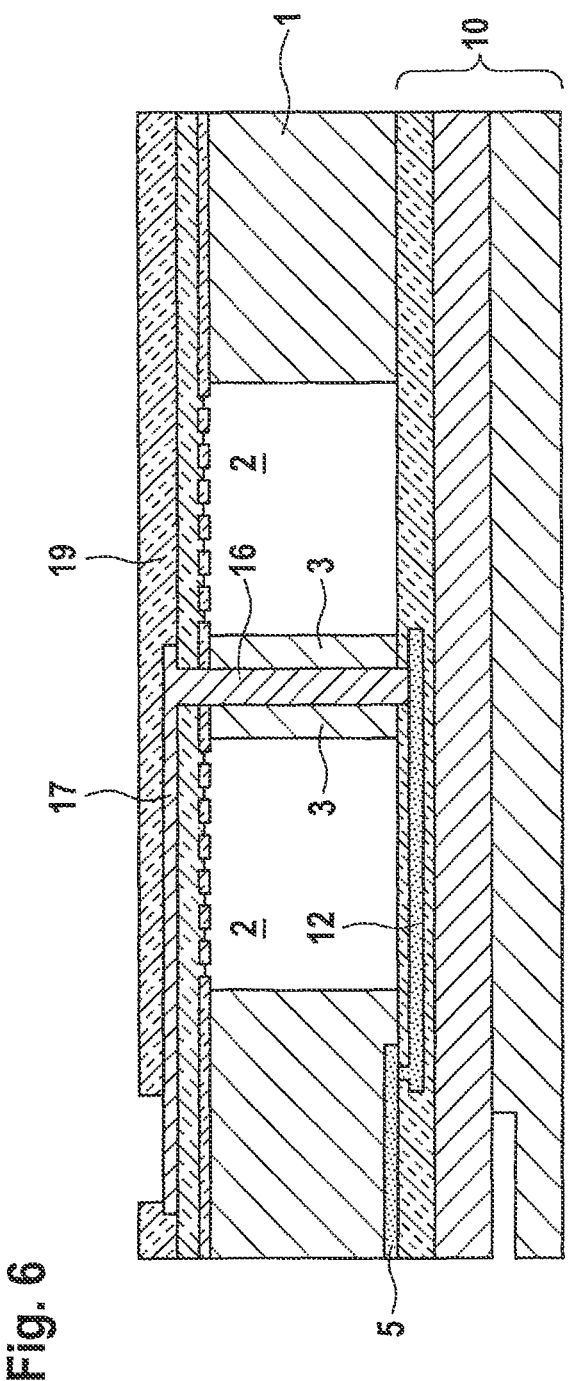

FIG. 6 shows another specific embodiment of the component, in which the cross-section of through-hole plating 16 does not widen in the region of first layer 6 but remains constant.

Through-hole plating 16 in FIG. 6 is developed as cylindrical solid material.

Figure 7:
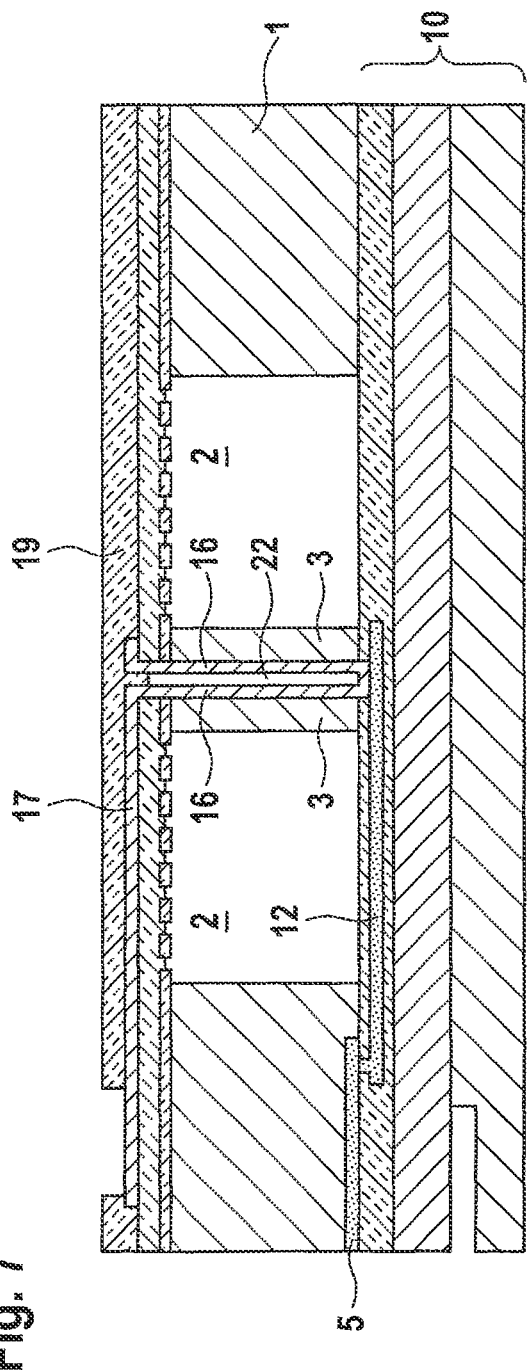

FIG. 7 shows another specific embodiment of the component, in which the diameter of through-hole plating 16 does not widen in the region of the first layer but instead remains constant, and a cavity 22 in through-hole plating 16 is provided in addition. As a result, through-hole plating 16 in FIG. 7 is designed in the form of a sleeve. Cavity 22 is sealed by protective layer 19 in the region of first layer 6.

Figure 8:
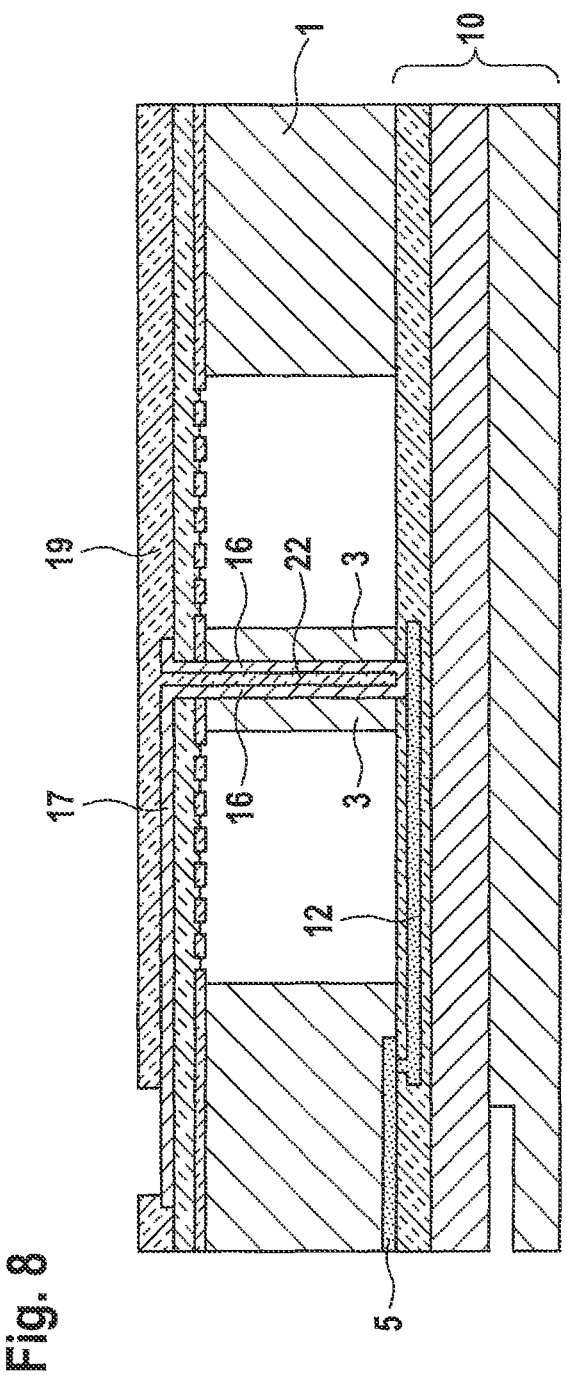

FIG. 8 essentially corresponds to the specific embodiment of FIG. 7, but cavity 22 is completely filled by protective layer 19.

Figure 9:
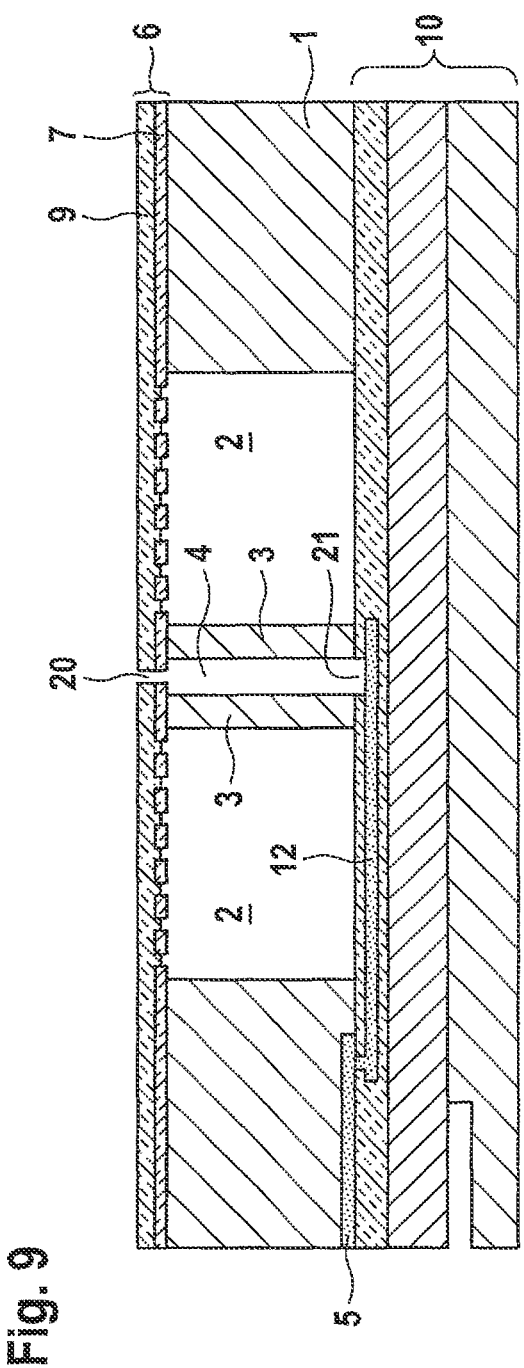
FIGS. 9 and 10 show two method steps for producing another specific embodiment of the component.
Figure 10:
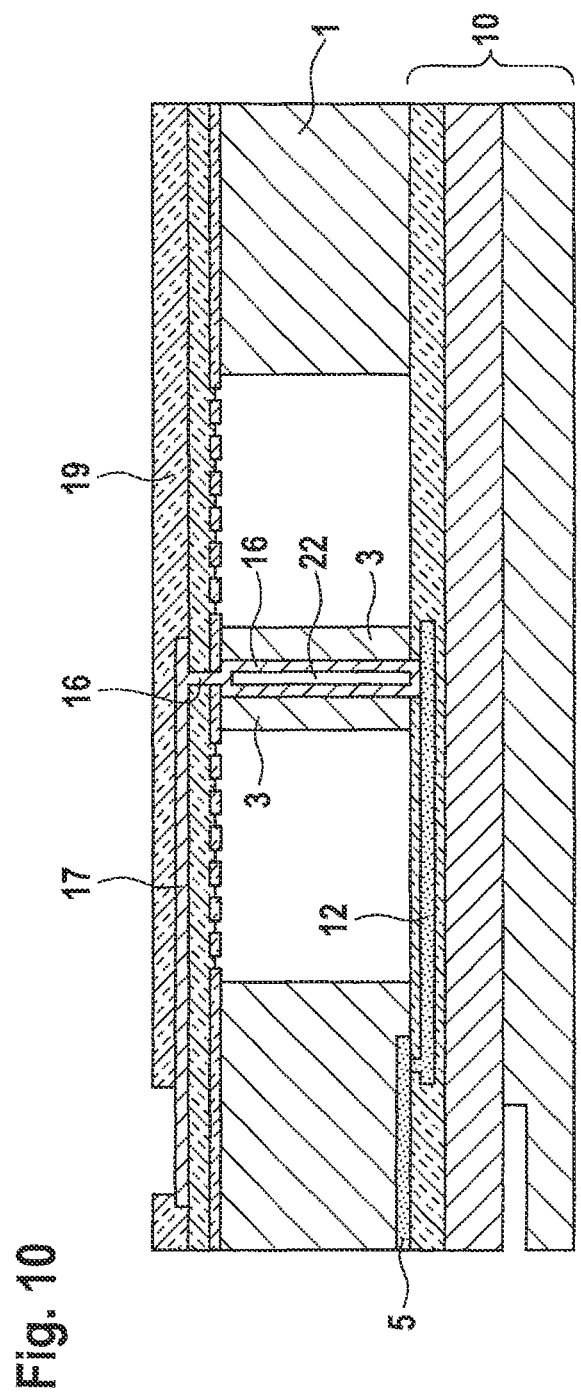

FIGS. 9 and 10 show the method steps for producing a sleeve-shaped through-hole plating 16, in which the cross-section of through-hole plating 16 in the region of first layer 6 is smaller than in the region of ring structure 3. FIG. 9 shows the method step in which access opening 20 in first layer 6 to second recess 4 is smaller than the diameter of second recess 4. This usually means that an unfilled cavity 22 remains when the metallic conductive material is deposited in the region of second recess 4, as illustrated in FIG. 10. The advantage of this development is that it allows stresses to be reduced in more optimal manner, the stresses being caused by the differences in the thermal coefficients of expansion between the electrically conductive material of the through-hole plating and the material of ring structure 3.

Figure 11:
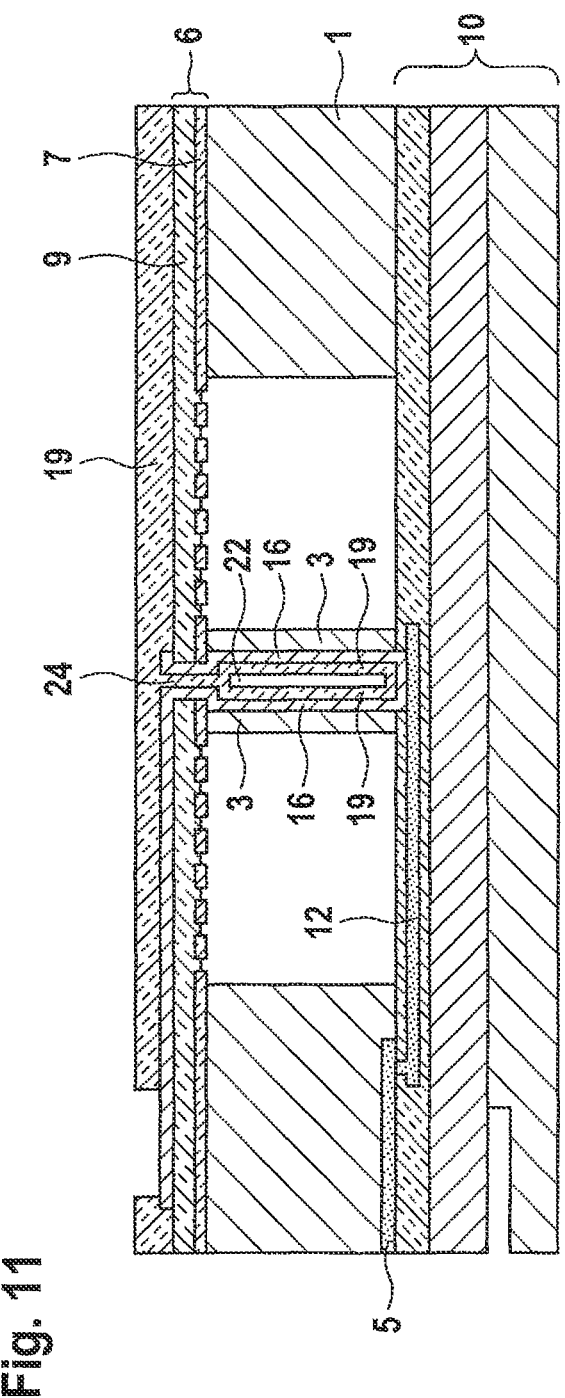
FIG. 11 shows an additional specific embodiment of the component.

FIG. 11 shows a further specific embodiment of the component, which has a through-hole plating 16 in the form of a sleeve, the diameter of the sleeve shape in the region of first layer 6 being smaller than in the region of ring structure 3. In addition, the sleeve-shaped through-hole plating 16 is covered by protective layer 19 on the inside, and an upper collar 24 of through-hole plating 16 is filled with the protective layer. Furthermore, an unfilled cavity 22 is formed in through-hole plating 16. In the exemplary embodiment shown, unfilled cavity 22 is enclosed by protective layer 19.

Figure 12:
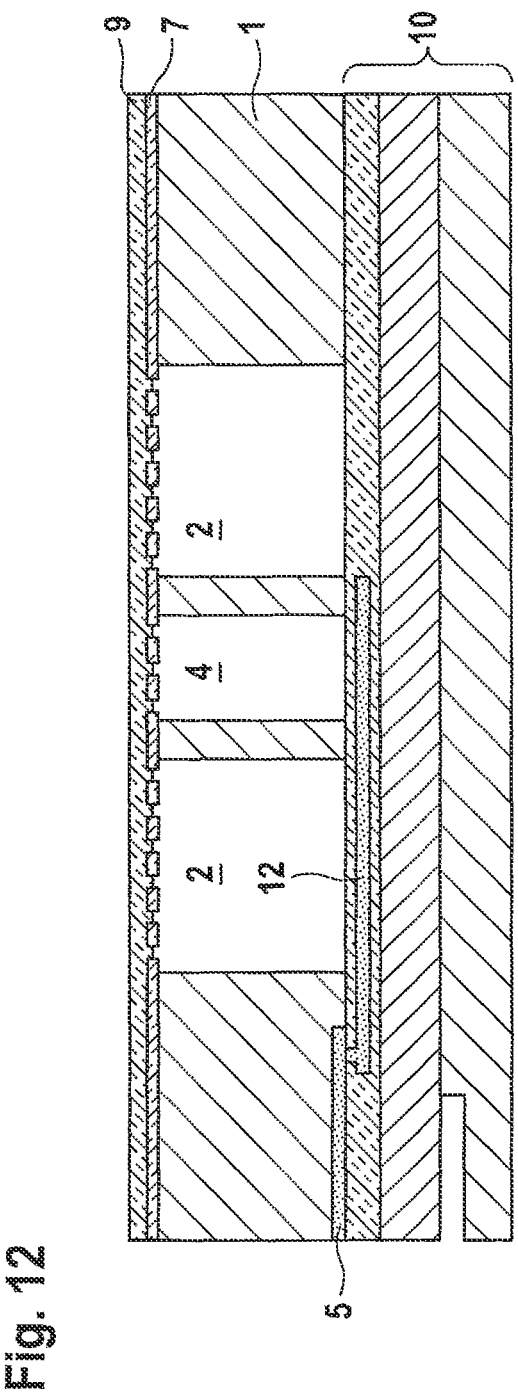
FIGS. 12 through 14 show method steps for producing another component.

Depending on which technique is used to produce low-impedance through-hole plating 16, it may be advantageous to provide a larger diameter for second recess 4. Since second recess 4 is to be produced at the same time as recess 2, it appears useful to remove the substrate material in the region of second recess 4 through a lattice mask in this case as well. Once lattice layer 7 has been sealed by sealing layer 9, a virtually level surface comes about, which then allows the use of standard processing steps such as the deposition of photosensitive resist using spin coating technology. This method step is illustrated in FIG. 12. FIG. 12 essentially corresponds to the system of FIG. 1, but the diameter of second recess 4 is greater and a lattice structure 8 of lattice layer 7 is disposed above second recess 4.

Figure 13:
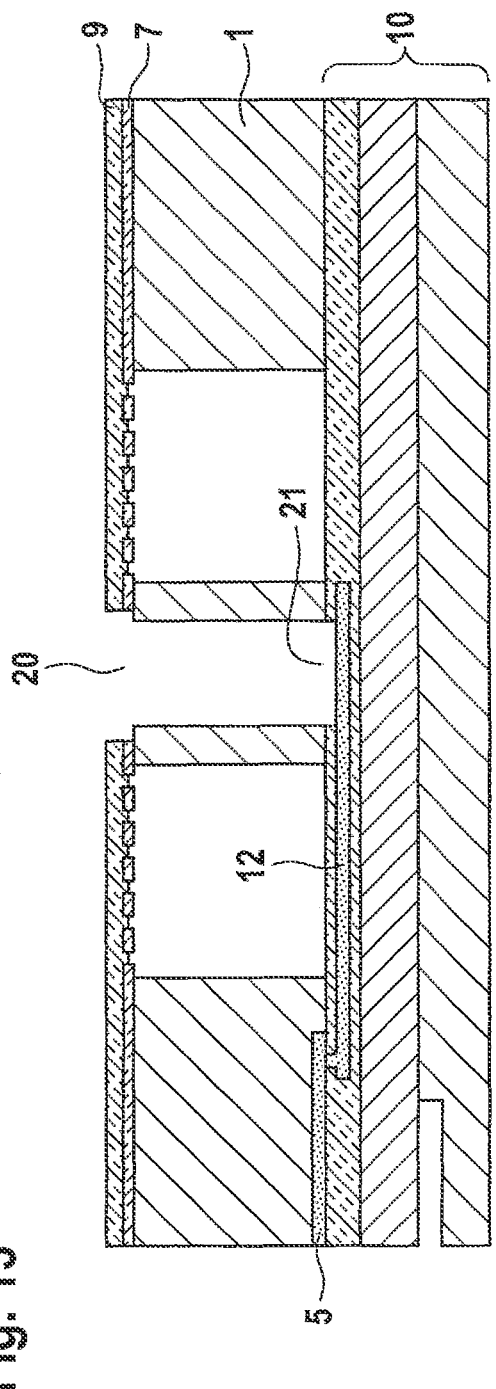
Figure 14:
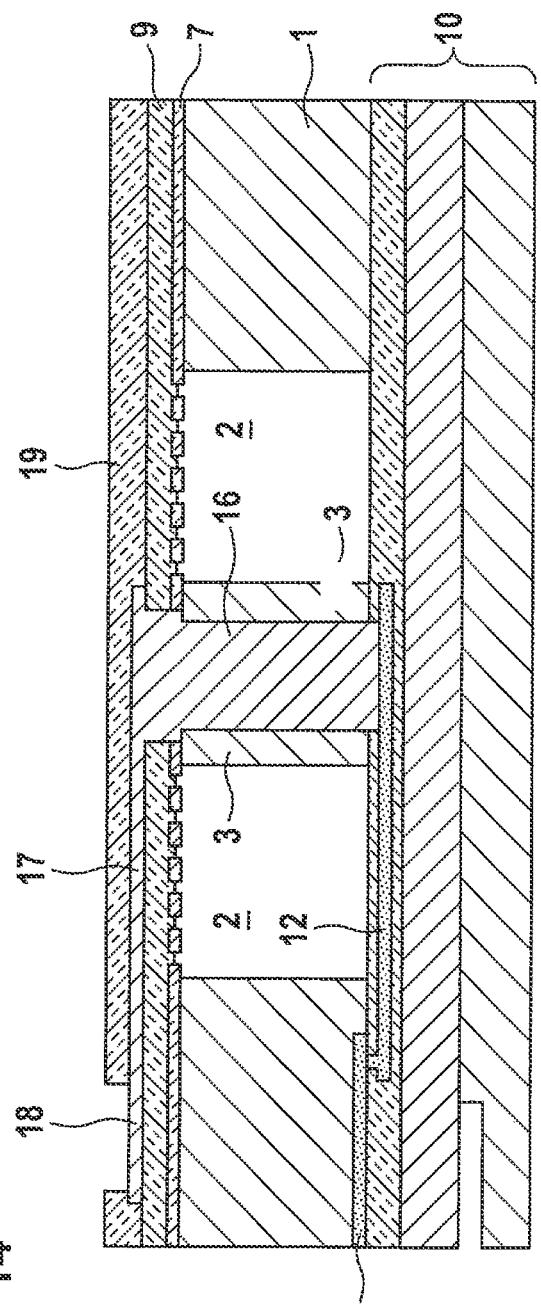

FIGS. 13 and 14 illustrate the method steps for producing cylindrical through-hole plating 16, which have already been explained in connection with FIGS. 2 and 3.

Figure 15:
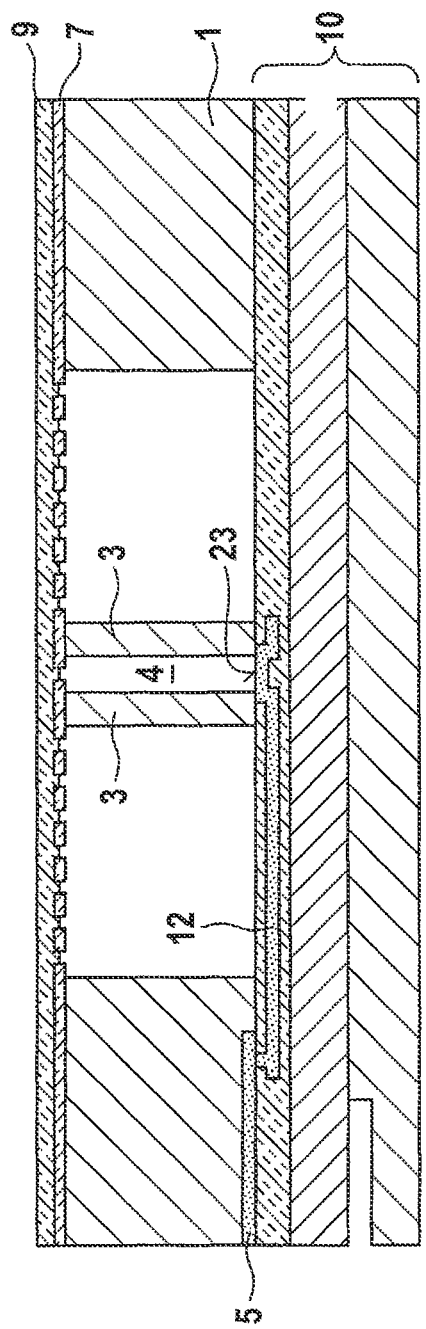
FIGS. 15 through 17 show method steps for producing another component.
Figure 16:
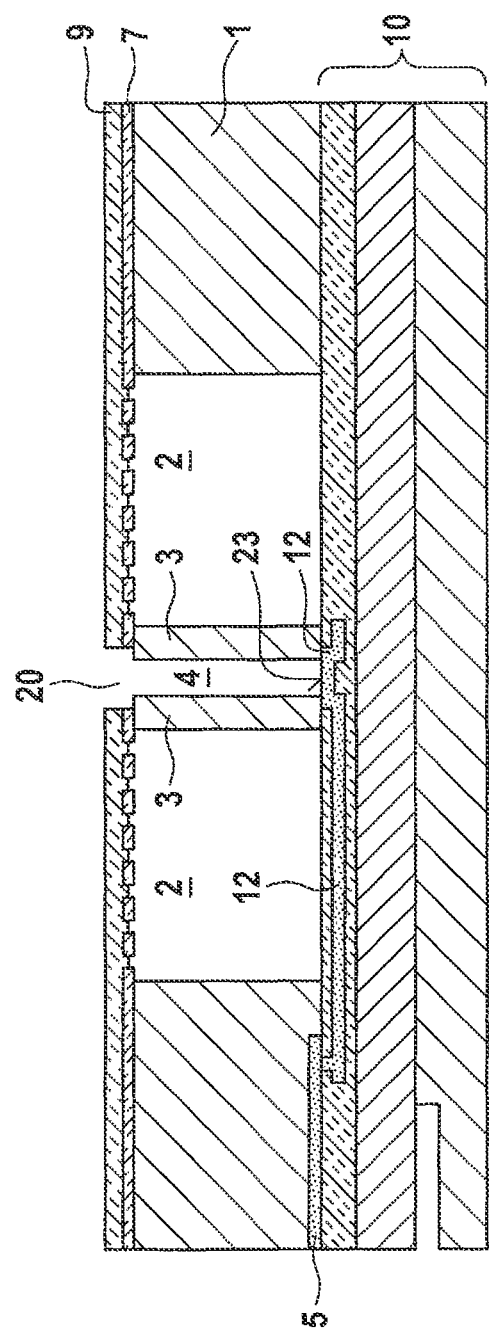
Figure 17:
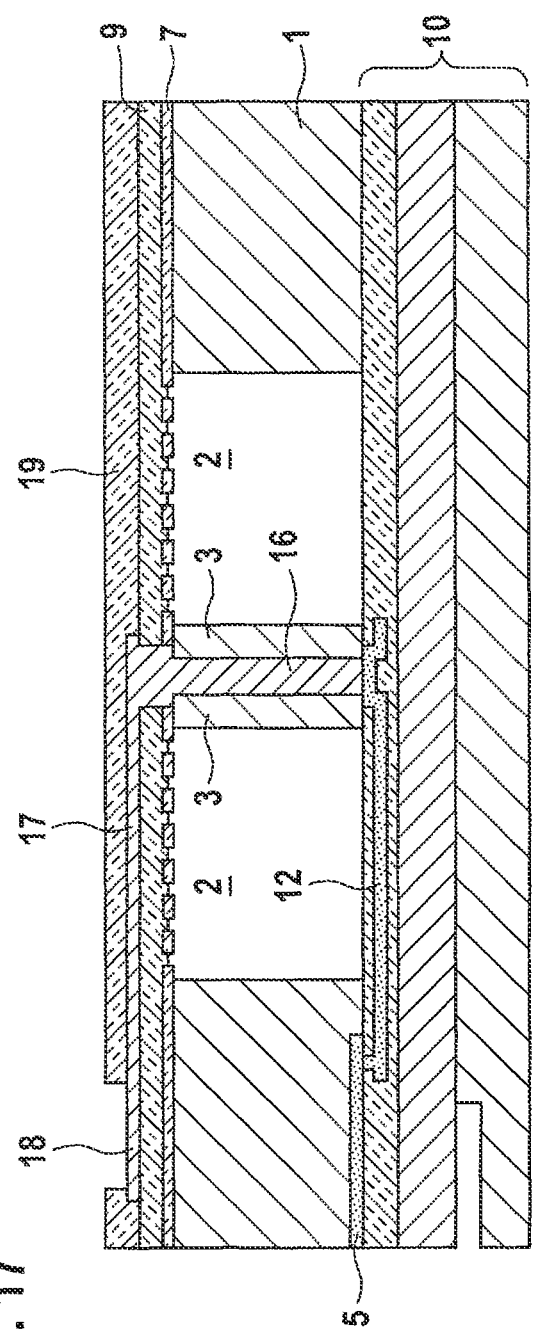
Figure 18:
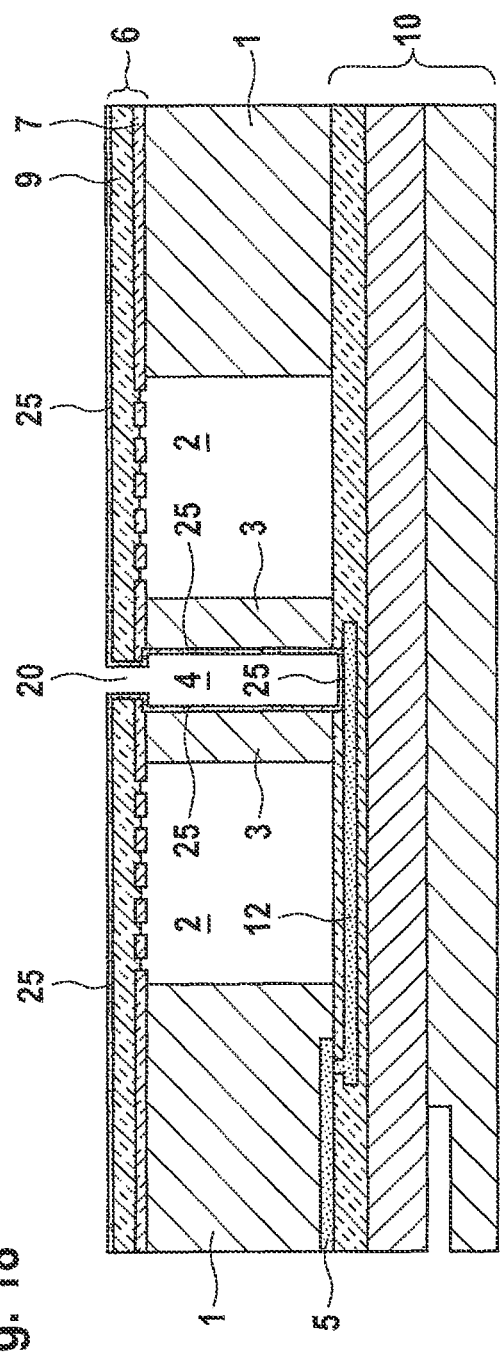
FIGS. 18 through 20 show method steps for producing another specific embodiment of a component.

FIGS. 15 through 17 show another variant for producing a through-hole plating, in which electrical line 12 is disposed in the area of the base of second recess 4 at the boundary surface to second recess 4. The advantage of this method is that little or no material of first insulation layer 11 needs to be removed to expose the contact region to electrical line 12 in the process of producing second recess 4. The insulation trench process used for developing first and second recesses 2, 4 stops on electrical line 12. The production process is therefore accelerated.

In a manner analogous to FIGS. 1 through 3, FIGS. 18 through 20 illustrate the method steps for forming a through-hole plating including a cavity 22, the cross-section of through-hole plating 16 being reduced in the region of the first layer in comparison with the region of ring structure 3.

Figure 19:
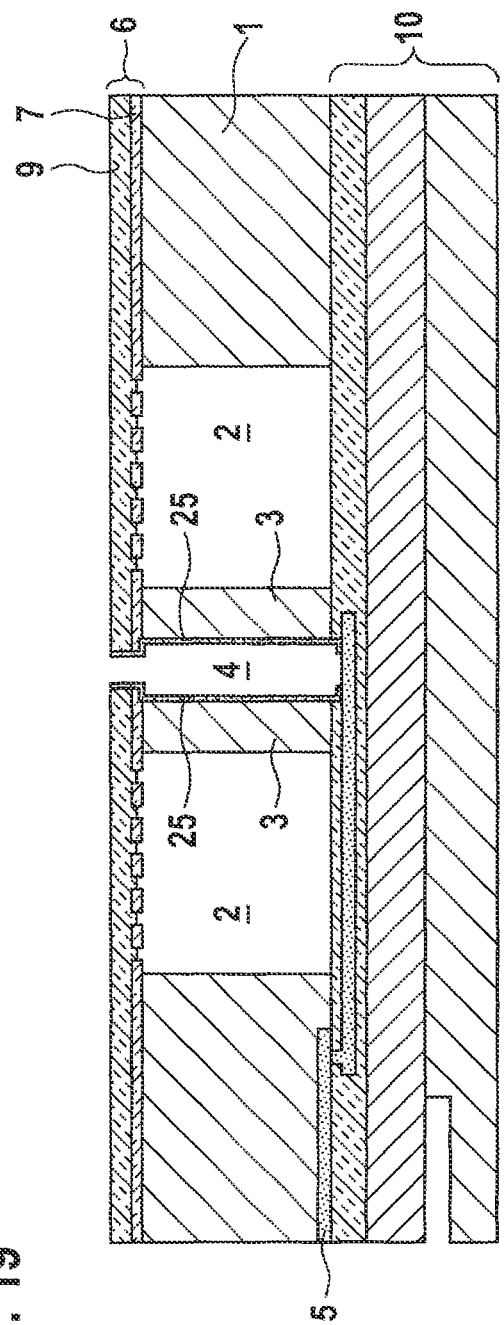

Prior to depositing the electrically conductive material to create through-hole plating 16, a second insulation layer 25 is deposited both on first layer 6 and in second recess 4 in addition. Electrical line 12 is covered as well in the process. In the following method step, which is illustrated in FIG. 19, second insulation layer 25 is removed from first layer 6 and from electrical line 12. Second insulation layer 25 may be produced from an oxide, such as silicon oxide. When using silicon oxide, second insulation layer 25 is able to be removed in the region of electrical line 12 and from the top side of first layer 6 with the aid of an anisotropic plasma-etching step. Second insulation layer 25 remains in the region of the inner surface of ring structure 3, and also in the throughfeed region of first layer 6. Then, through-hole plating 16 with a cavity 22 is introduced into second recess 4. In addition, circuit track 17 is deposited and protective layer 19 is applied.

Figure 20:
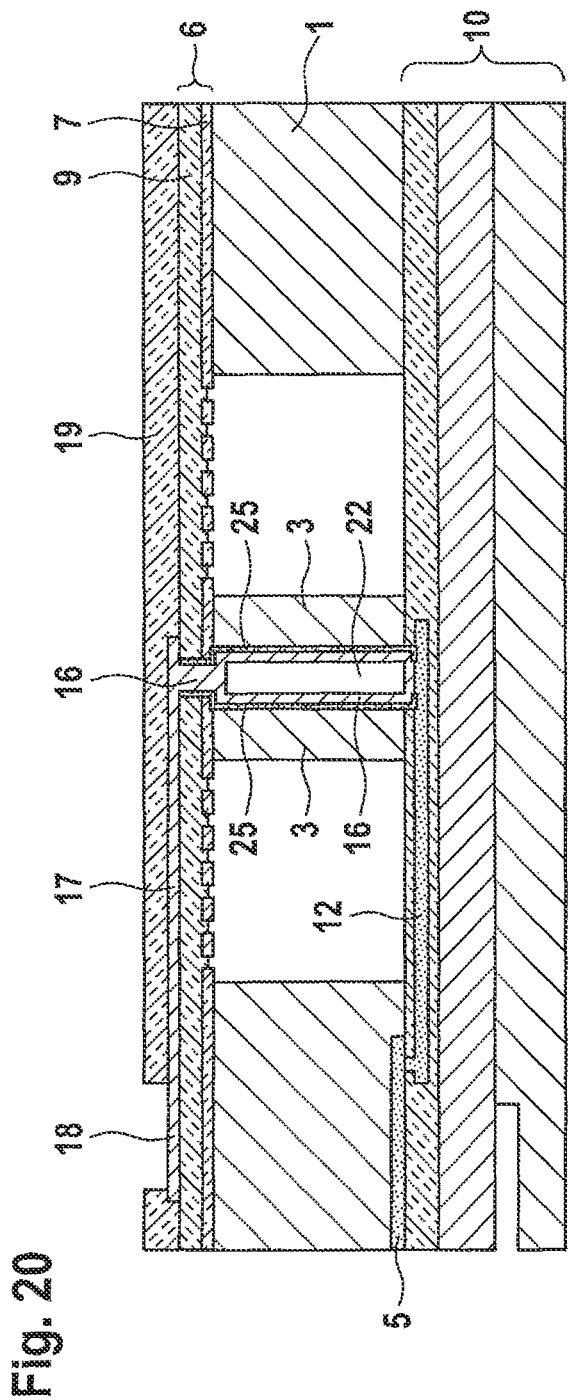

In this way an electrically insulated through-hole plating 16 is produced in ring structure 3, as illustrated in FIG. 20. The through-hole plating of FIG. 20 has a cavity 22. Depending on the selected specific embodiment, the type of through-hole plating 16 may also have the other forms described earlier already. One advantage of second insulation layer 25 is that through-hole plating 16 is electrically insulated from surrounding ring structure 3.

Figure 21:
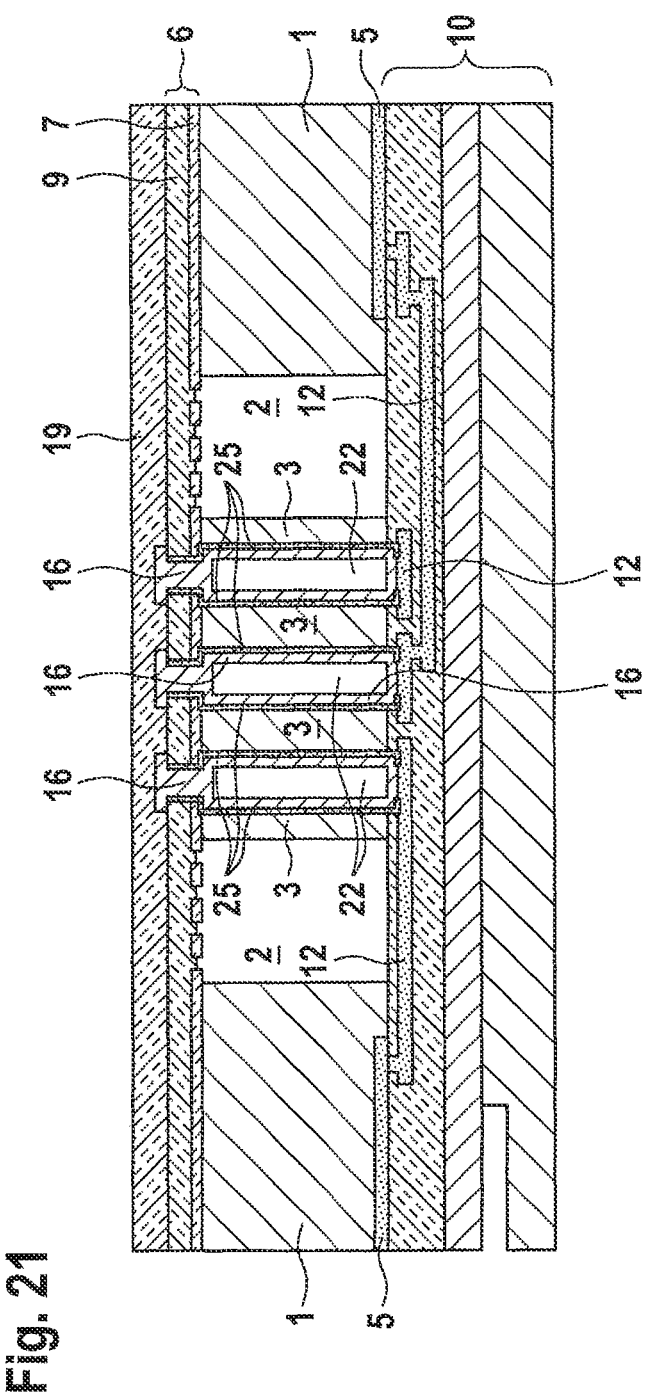
FIGS. 21 through 23 show different specific embodiments of the components provided with a plurality of through-hole platings in a ring structure.

Because of the placement of second insulation layer 25, a plurality of electric through-hole platings 16 may be situated in a cohesive ring structure 3, as shown in FIG. 21. The three through-hole platings 16 illustrated in FIG. 21 have an identical design and are electrically insulated from each other. Depending on the selected interconnection of through-hole platings 16, through-hole platings 16 of ring structure 3 may form a capacitor which is connected to further electrical circuits 5, e.g., circuit components of an ASIC. In addition, each through-hole plating 16 is connected to a separate electrical line 12. The function of the dielectric is assumed by additionally deposited second insulation layer 25 and the material of ring structure 3, which is made of silicon, for example. Using the described methods, both cylinder and plate capacitors having high capacitances are able to be developed within substrate 1. This specific embodiment is particularly suitable when substrate 1 is developed in the form of a sensor wafer.

Figure 22:
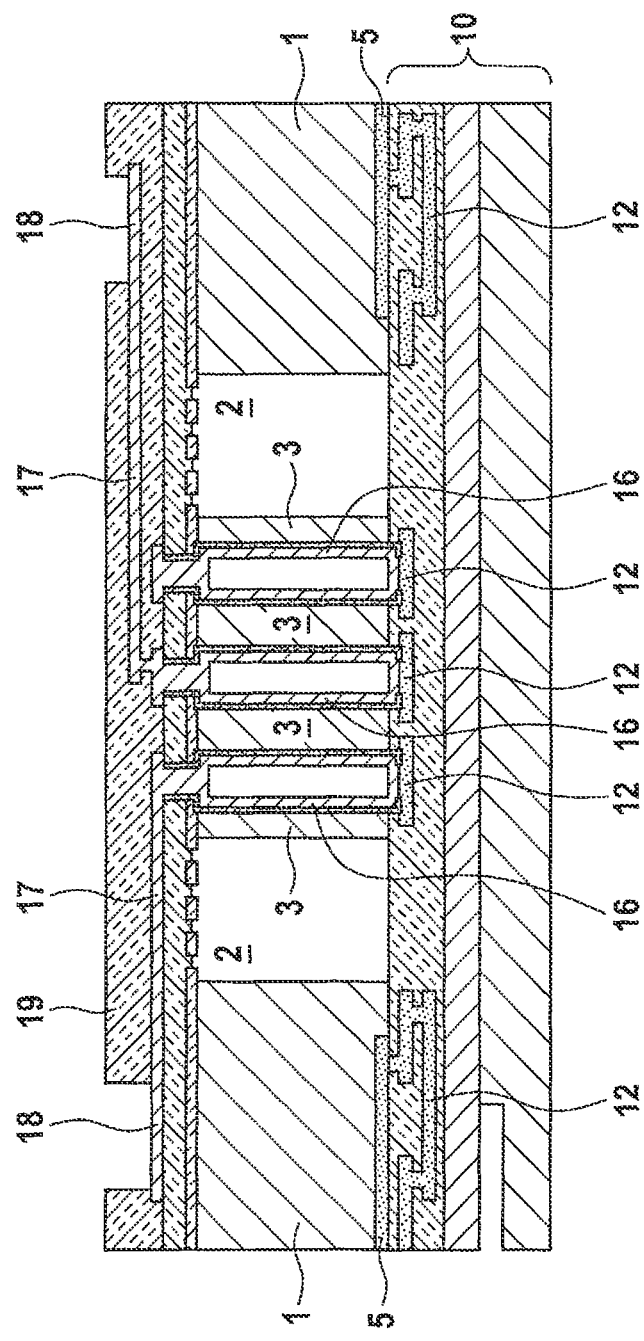

FIG. 22 shows a system having a plurality of through-hole platings 16 according to FIG. 21; in this case, however, through-hole platings 16 may form a capacitor and are connected to bond pads 18 via circuit tracks 17. On the underside, through-hole platings 16 are connected to electrical lines 12, which are situated inside first insulation layer 11, but are not necessarily connected to electric circuits 5 and which assume the function of an etching stop layer. With the aid of such capacitor structures, for example, it is possible to reduce or eliminate interference voltages in access lines to electric circuits, such as an ASIC.

However, as previously described, given a suitable design and layout, it is also possible to realize coils that are integratable into electric circuits.

Figure 23:
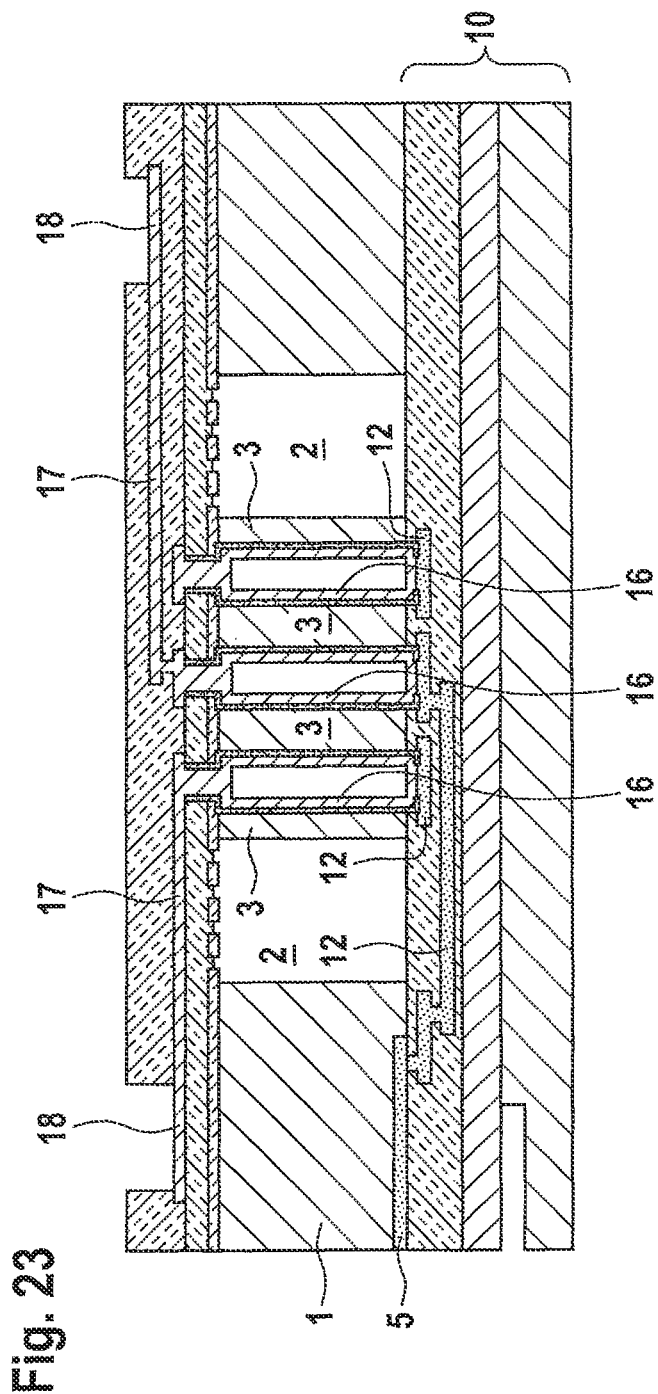

FIG. 23 shows a specific embodiment which has a ring structure 3 with a plurality of through-hole platings 16, which are electrically insulated from ring structure 3 by second insulation layers 25. The center through-hole plating serves as signal path, and the through-hole platings on the side are provided simply for shielding purposes. Only center through-hole plating 16 is connected to an electric circuit 5. Instead of two lateral through-hole platings, it is also possible to provide additional lateral through-hole platings, which surround a center through-hole plating in annular manner and function as shield. This realizes an electric shield around a signal path through substrate 1. Depending on the specific embodiment selected, it is also possible to remove the material of ring structure 3 between through-hole platings 16 provided with second insulation layer 25.

Figure 24:
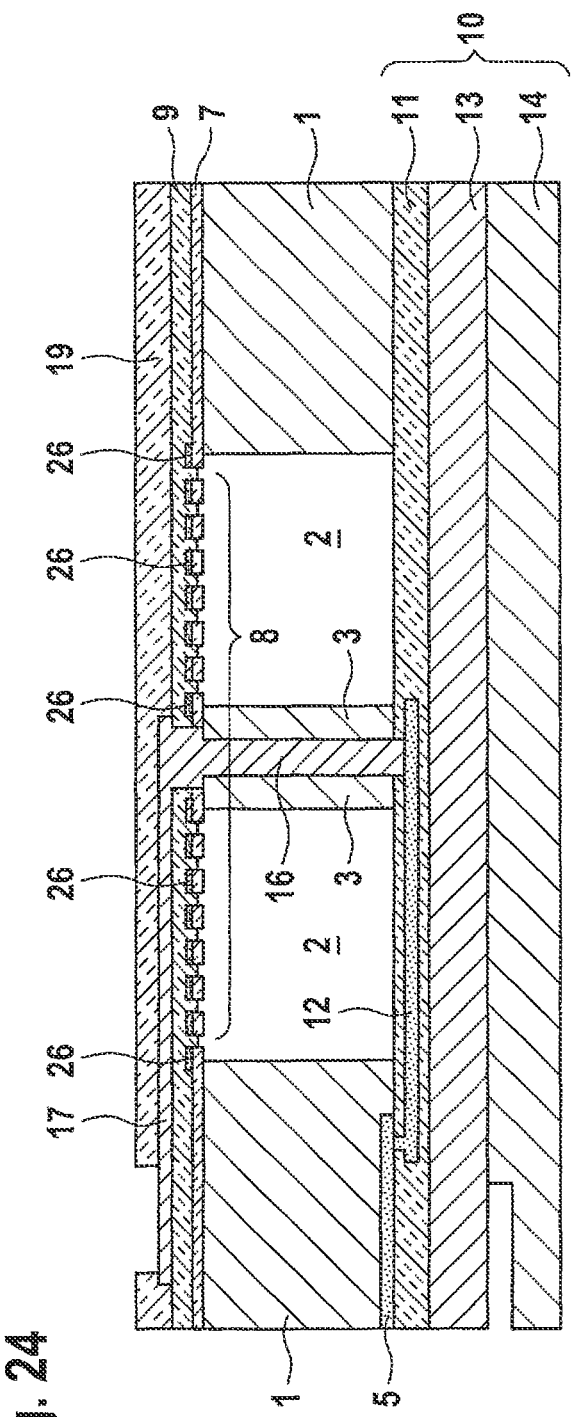
FIGS. 24 through 27 show different specific embodiments of the component provided with a second lattice structure.

FIG. 24 shows another specific embodiment of the component, which essentially corresponds to the specific embodiment of FIG. 3; however, a second lattice layer 26 is situated between lattice layer 7 and sealing layer 9 in addition, especially in the region of lattice structure 8. Second lattice layer 26 may have a similar or the same shape as lattice structure 8 or lattice layer 7. Second lattice layer 26 is produced from an electrically conductive material, especially a metal material. Instead of two lattice layers 7, 26, it is also possible to form only a single lattice layer 7, which is produced from an electrically conducting material, especially a metal, and which may be situated directly on substrate 1 in regions of lattice structure 8. In this specific embodiment, however, it must be ensured that no short circuit is produced between through-hole plating 16 and substrate 1 surrounding the contacting. The metal, for example, may be an aluminum-copper mixture. One advantage of the electrically conductive lattice layer is that during the insulation trenching process, in the course of which recess 2 and second recess 4 are produced at the same time/simultaneously, the etching attack on metallic lattice 26 is considerably milder than in the case of a lattice 8 produced from an insulation material, especially a silicon oxide. This in turn has the result that the etch holes of the lattice widen only minimally and that less material of sealing layer 9 needs to be deposited, especially an oxide, to seal them. This advantage is apparent at high etching depths and the related long etching times, in particular.

Figure 25:
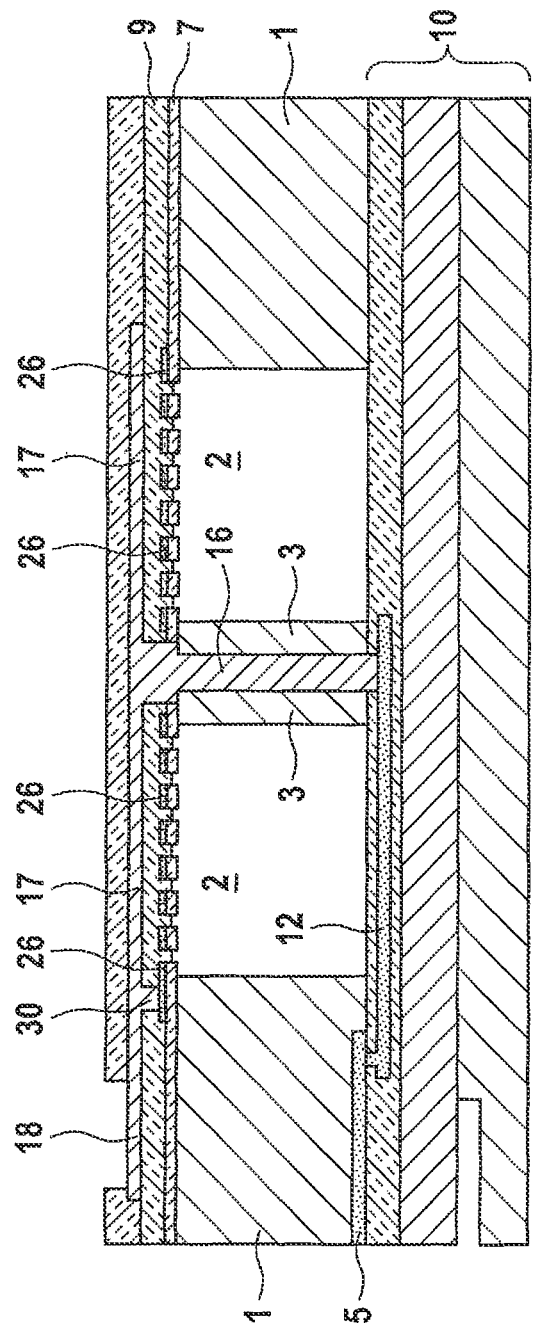

FIG. 25 shows another variant of the specific embodiment of FIG. 24, in which second lattice layer 26 is connected to circuit track 17 via a connection. This provides a potential adjustment between circuit track 17 and second lattice layer 26. In addition, FIG. 25 has another special feature, i.e., that the surface of circuit track 17 is so large that entire recess 2 is covered. Circuit track 17 therefore has at least one circular or angular section. In this way lattice structure 8 and second lattice layer 26 are covered by circuit track 17. In addition, large-area circuit track 17, for example, acts as a barrier layer with respect to moisture which could penetrate the second recess lying underneath.

Figure 26:
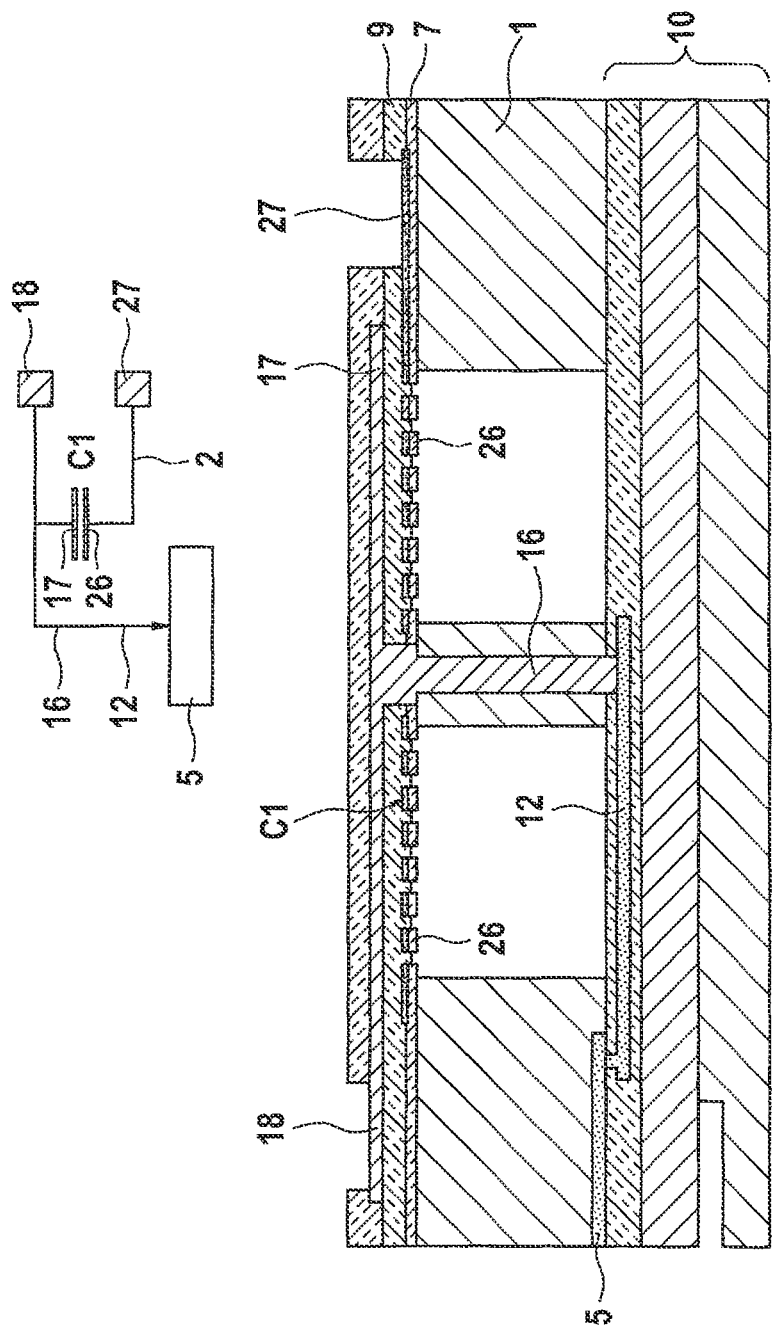

FIG. 26 shows another specific embodiment, which essentially corresponds to that of FIG. 25, but in which second lattice layer 26 is electrically separated from circuit track 17 and has its own bond pad 27. Above the illustration of component 15, an equivalent circuit diagram for circuit track 17 with through-hole plating 16 and second lattice layer 26 is shown, a capacitance C1 being formed between circuit track 17 and the electrically conductive second lattice layer. With the aid of the system shown in FIG. 26, a planar capacitor structure is able to be set up, which is essentially formed by circuit track 17 and second lattice layer 26. For example, the capacitor structure may be used to suppress interference signals carried in signals routed via circuit track 17 and through-hole plating 16 to an electric circuit 5, in particular an ASIC, with the aid of second lattice layer 26 which acts as counter electrode of a capacitor, in particular.

Figure 27:
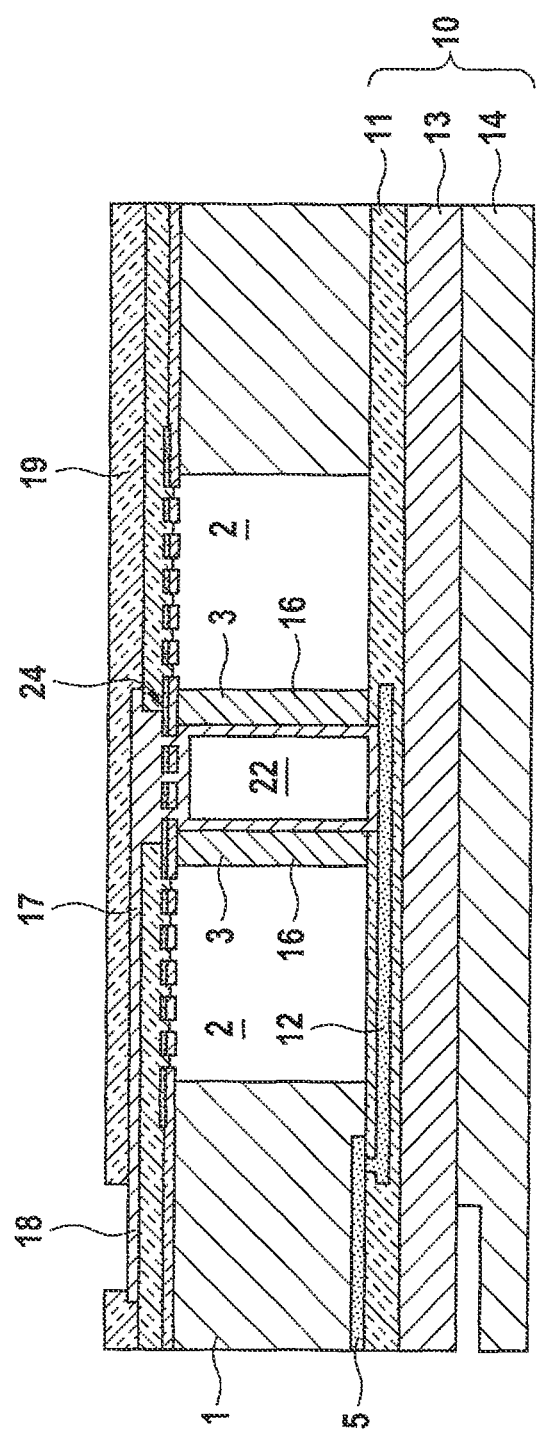

FIG. 27 shows another specific embodiment, which essentially corresponds to the specific embodiment of FIG. 24, but in which through-hole plating 16 includes a cavity 22, in contrast to the specific embodiment of FIG. 24. In addition, the cross section of second recess 4 has a larger value than the cross section of second recess 4 of FIG. 24. Furthermore, lattice layer 7 and second lattice layer 26 are disposed in the region of collar 24 of through-hole plating 16. This means that second lattice layer 26 is directly connected to through-hole plating 16 in electrically conductive manner via collar 24.

The large width of opening 20 and the large width of second recess 4 may be used to deposit a low-impedance material such as wolfram or aluminum in second recess 4, employing a CVD or an ALD method. The low-impedance material preferably deposits on the surfaces there. The deposition process is continued until first and second lattice layer 7, 26 have grown over at the surface. This specific embodiment offers the advantage that notwithstanding large opening 20, which offers advantages with regard to the removal rate to form second recess 4, sealing of first and second lattice structure 8, 26 is achievable through the low-impedance material, without a large topography being formed on the surface of substrate 1. Once the metallization has been deposited, it is already possible to use standard lithography methods to pattern the deposited metallic layer.

The described component and the described method are able to be employed in all products in which flip chip technology is used for the electrical contacting.

The figures show a ring structure 3 in each case; a plurality of ring structures having through-hole platings is able to be introduced or placed in a semiconductor substrate at the same time.

All specific embodiments have in common that ring structure 3 need not necessarily have a circular or round form, but that other forms may be selected as well. In the same way, through-hole plating 16 may have a variety of cross-sections.

What is claimed is:

1. A component, comprising:
   a semiconductor substrate including a through-hole plating, wherein the through-hole plating is surrounded by a recess, and wherein the semiconductor substrate has a first layer on a first side, the first layer covering the recess on the first side, and wherein the semiconductor substrate has a second layer on a second side, the second layer covering the recess on the second side, wherein the first layer at least partially has a layer in the form of a lattice structure above the recess and in the region of the through-hole plating; and
   a circuit track provided on the first layer of the semiconductor substrate, the circuit track being connected to the through-hole plating;
   wherein the through-hole plating is surrounded by a ring structure produced from the semiconductor substrate.

2. The component as recited in claim 1, wherein the through-hole plating is configured in the form of a sleeve.

3. The component as recited in claim 2, wherein the through-hole plating has a cylindrical cavity.

4. The component as recited in claim 2, wherein the through-hole plating has one of a widening or a tapering diameter in the region of the first layer.

5. The component as recited in claim 2, wherein the circuit track is an electrically conductive circuit track which is situated one of inside or on top of the first layer and connects a bond pad with the through-hole plating in electrically conducting manner.

6. The component as recited in claim 2, wherein an electrically conductive line is provided in the second layer, the electrically conductive line being connected to one of a component of the semiconductor layer or the second layer.

7. The component as recited in claim 2, wherein the second layer has a sensor layer having at least one sensor structure.

8. The component as recited in claim 5, wherein the circuit track covers the recess.

9. The component as recited in claim 1, wherein the through-hole plating is configured in the form of a sleeve, wherein the circuit track is an electrically conductive circuit track which is situated one of inside or on top of the first layer and connects a bond pad with the through-hole plating in electrically conducting manner, and wherein the second layer has a sensor layer having at least one sensor structure.

10. The component as recited in claim 9, wherein the through-hole plating has a cylindrical cavity.

11. The component as recited in claim 9, wherein the through-hole plating has one of a widening or a tapering diameter in the region of the first layer.

12. The component as recited in claim 9, wherein the circuit track covers the recess.

13. The component as recited in claim 1, wherein the through-hole plating is configured in the form of a sleeve, wherein an electrically conductive line is provided in the second layer, the electrically conductive line being connected to one of a component of the semiconductor layer or the second layer, and wherein the second layer has a sensor layer having at least one sensor structure.

14. The component as recited in claim 13, wherein the through-hole plating has a cylindrical cavity.

15. The component as recited in claim 13, wherein the through-hole plating has one of a widening or a tapering diameter in the region of the first layer.

16. The component as recited in claim 13, wherein the circuit track covers the recess.

* * * * *